May 8, 1956 F. R. STANSEL 2,745,010
TRANSISTOR OSCILLATORS
Filed Sept. 12, 1951 2 Sheets-Sheet 1

INVENTOR
F. R. STANSEL
BY H. A. Burgess
ATTORNEY

May 8, 1956 F. R. STANSEL 2,745,010
TRANSISTOR OSCILLATORS
Filed Sept. 12, 1951 2 Sheets-Sheet 2

INVENTOR
F. R. STANSEL
BY
H. A. Burgess
ATTORNEY

United States Patent Office 2,745,010

Patented May 8, 1956

2,745,010

TRANSISTOR OSCILLATORS

Frank R. Stansel, Millburn, N. J., assignor to Bell Telephone Laboratories, Incorporated, New York, N. Y., a corporation of New York Application September 12, 1951, Serial No. 246,226

6 Claims. (Cl. 250—36)

This invention relates generally to transistor oscillators and more particularly to transistor oscillators which are coupled to low input-impedance amplifiers for increased output.

The principal object of the invention is to increase the output that is avialable from a transistor oscillator-amplifier combination.

A related object is to permit the use of a large load resistor in a transistor oscillator without causing reduction of the output of the transistor amplifier to which the oscillator is coupled.

A simple transistor oscillator which has been found useful in the past is one in which a frequency-determining impedance, such as a series-resonant circuit or a piezoelectric crystal, is connected between the emitter and collector electrodes of the transistor. Several such oscillators are disclosed in application Serial No. 67,937, filed December 29, 1948, by R. L. Hanson (United States Patent 2,692,337 issued October 19, 1954). When output greater than that obtainable from the oscillator alone has been desired, one way of securing it has been to couple the oscillator output to a transistor amplifier through a load resistor in the collector-base path of the transistor. While satisfactory for many purposes, such an arrangement remains unnecessarily limited in total available power output. The load resistor in the transistor oscillator should be large to insure oscillation, but a large load resistor reduces the amplitude of the alternating current flowing through it. Since transistor amplifiers are current-operated devices, such a reduction reduces the output of the amplifier.

In accordance with the present invention, the input side of the amplifier is connected in series with the frequency-determining impedance between the emitter and collector electrodes of the oscillator transistor. The amplifier, which is preferably a transistor amplifier of the so-called "grounded-base" type, has a low input impedance and does not disturb the operation of the oscillator to any appreciable degree. Since the amplifier is not dependent upon the alternating current flowing through the load resistor of the oscillator for its operation, that element may be made as large as necessary to insure oscillation without detracting from the power output of the system.

A more complete understanding of the invention may be secured from a study of the following detailed description of several specific embodiments. In the drawings.

Figure 1:
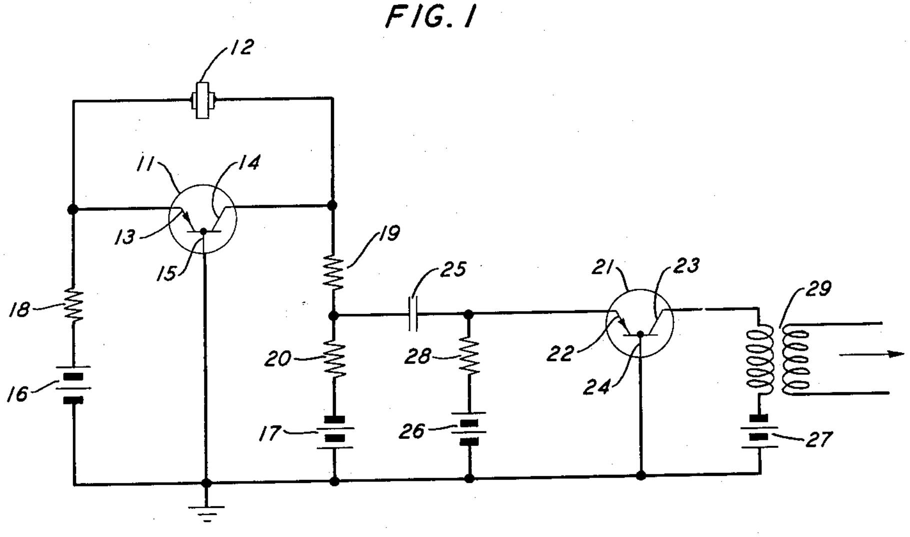
Fig. 1 is a schematic diagram of a transistor oscillator-amplifier combination of the type known in the prior art.

As has been indicated, the circuit illustrated in Fig. 1 is representtaive of the pertinent prior art. The oscillator comprises a transistor 11, a piezoelectric crystal 12, and the various means for supplying operating potentials to the transistor electrodes. For discussion purposes, the body of transistor 11 is assumed to comprise semiconductive material of the so-called *n*-type, as is indicated by the conventional transistor symbol in which the emitter arrow points toward the body rather than away from it. The transistor electrodes are, respectively, an emitter 13, a collector 14, and a base 15. The base of transistor 11 is grounded, the emitter is supplied with a positive potential by a battery 16, and the collector is supplied with a negative potential by a battery 17. In the language of the rectifier art, battery 16 may be thought of as biasing the emitter of transistor 11 in the forward direction, while battery 17 may be thought of as biasing the collector in the reverse direction. A direct-current feed resistor 18 is connected between battery 16 and the emitter, while a load resistor 19 and another direct-current feed resistor 20 are connected in series between battery 17 and the collector. Crystal 12, which is equivalent to a series-resonant inductance-capacitance circuit, serves as a frequency-determining impedance and is connected between the emitter and the collector. Since the emitter and the collector currents are in phase with one another, the resulting positive feedback at the desired frequency results in sustained oscillations.

In the past, one way of securing increased output has been to couple an amplifier between the junction of load resistor 19 and feed resistor 20 and ground. In Fig. 1, the amplifying element is a second transistor 21, the electrodes of which are, respectively, an emitter 22, a collector 23, and a base 24. For discussion purposes, transistor 21 is also assumed to have a body which comprises *n*-type semiconductive material. A coupling condenser 25 is connected between the junction of load resistor 19 and feed resistor 20 and the emitter of transistor 21. The emitter of transistor 21 is supplied with a positive potential by a battery 26, the collector is supplied with a negative potential by a battery 27, and the base is grounded. A direct-current feed resistor 28 is connected between battery 26 and the emitter of transistor 21, while the primary winding of an output transformer 29 is connected between battery 27 and the collector. Transformer 29, it should be understood, only typifies many types of output circuits which may be used. Others, including simple impedance networks, may be used to advantage in many instances.

Figure 2:
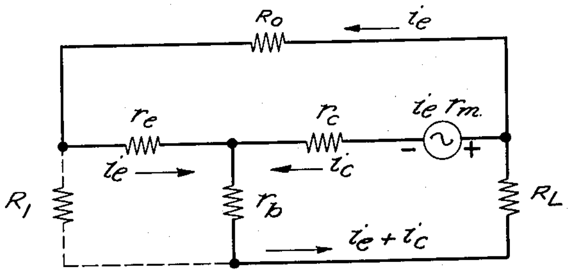
Fig. 2 is an equivalent circuit of the oscillator portion of the system shown in Fig. 1.

In order to insure oscillations in the circuit of Fig. 1, load resistor 19 should generally be relatively large, as may be demonstrated by a simple mathematical analysis of the oscillator. An equivalent circuit is shown in Fig. 2, where $R_O$ represents the equivalent resistance of crystal 12, $R_1$ is the resistance of feed 18, and $R_L$ represents the effective combination of the resistances of load resistor 19 and feed resistor 20 and the input resistance of the amplifier. Transistor 11 is represented by the conventional equivalent network comprising resistances $r_e$, $r_c$, and $r_b$ and generator $i_e r_m$, where $r_e$ is the emitter resistance, $r_c$ is the collector resistance, $r_b$ is the base resistance, and $r_m$ is the mutual resistance of the transistor. The various currents flowing in the circuit are the emitter current $i_e$, the collector current $i_c$, and combinations of the two. Thus, the current flowing through $R_O$ is the emitter current $i_e$, while that flowing through $R_L$ is the algebraic sum of the emitted current $i_e$ and the collector current $i_c$. Since oscilloscope studies show that $R_1$ passes current only on the peaks of oscillations, it is omitted from the following analysis, the results of which constitute an approximation valid over most of the oscillation cycle and characterize the conditions necessary for the start of oscillations.

The equations for Fig. 2 are:

$$-i_e r_m = i_c r_c + (i_e + i_c) r_b + (i_e + i_c) R_L \qquad (1)$$

and $$-i_e r_m = i_c r_c - i_e(r_e + R_O) \quad (2)$$

Rewritten, these appear as $$O = i_e(r_m + r_b + R_L) + i_c(r_c + r_b + R_L) \quad (3)$$

and $$O = i_e(r_m - r_e - R_O) + i_c r_c \quad (4)$$

In determinant form, $$i_e = \frac{\begin{vmatrix} O & (r_c + r_b + R_L) \\ O & r_c \end{vmatrix}}{\Delta} \quad (5)$$

Since $i_e$ in Equation (5) can exist only if $\Delta$ is equal to zero, $$\begin{vmatrix} (r_m + r_b + R_L) & (r_c + r_b + R_L) \\ (r_m - r_e - R_O) & r_c \end{vmatrix} \neq 0 \quad (6)$$

and $$r_c(r_m + r_b + R_L) = (r_m - r_e - R_O)(r_c + r_b + R_L) \quad (7)$$

Assuming that $r_b$ is small in comparison with $R_L$ and that $r_e$ is small in comparison with $R_O$, $$\frac{r_m}{r_c} + \frac{R_L}{r_c} = \left[\frac{r_m}{r_c} - \frac{R_O}{r_c}\right]\left[1 + \frac{R_L}{r_c}\right] \quad (8)$$

Since $\alpha$, the current gain of the transistor, is approximately equal to $r_m/r_c$, $$\alpha + \frac{R_L}{r_c} = \alpha\left[1 + \frac{R_L}{r_c}\right] - \frac{R_O}{r_c}\left[1 + \frac{R_L}{r_c}\right] \quad (9)$$

Equation 9 simplifies to $$\alpha\frac{R_L}{r_c} = \frac{R_L}{r_c} + \frac{R_O}{r_c} + \frac{R_O}{r_c}\frac{R_L}{r_c} \quad (10)$$

Therefore, $$\alpha = 1 + \frac{R_O}{R_L} + \frac{R_O}{r_c} \quad (11)$$

As given in the article, "Some Circuit Aspects of the Transistor," by R. M. Ryder and R. J. Kircher, appearing on page 367 of the July 1949 issue of the Bell System Technical Journal, typical equivalent circuit parameter values for one type of point contact transistor are $r_e=240$ ohms, $r_c=19{,}000$ ohms, $r_b=290$ ohms, and $r_m=34{,}000$ ohms. Typical values of $\alpha$ for this type of transistor are in the range of from 2 to 3.

In circuits of the type shown in Fig. 1, the magnitude of $R_O$ is dependent on the type of piezoelectric crystal used. For one type frequently used, $R_O$ is of the order of 2000 to 6000 ohms, making the last terms of Equation 11 of only second order importance. Thus, in their simplest form, the conditions for oscillation in a circuit of the type under consideration may be reprsented by the expression $$\alpha \geqq 1 + \frac{R_O}{R_L} \quad (12)$$

In order to insure oscillation, it is, therefore, desirable to make $R_L$ large. However, a large value of $R_L$ reduces the alternating current flowing through thhe load resistor and hence through any transistor amplifier coupled to the oscillator in the manner shown in Fig. 1. As transistor amplifiers are current-operated devices, such a reduction reduces the output of the amplifier.

In accordance with the present invention, the amplifier is coupled to the branch of the oscillator circuit containing the piezoelectric crystal 12. The so-called "grounded-base" transistor amplifier is characterized by a low input resistance, which is small in comparison with the equivalent resistance of the crystal, and hence does not disturb the operation of the circuit. Since the current passing through the load resistor does not form the input to the amplifier, the load resistor may be made as large as desired without adversely affecting the output of the oscillator-amplifier combination.

Figure 3:
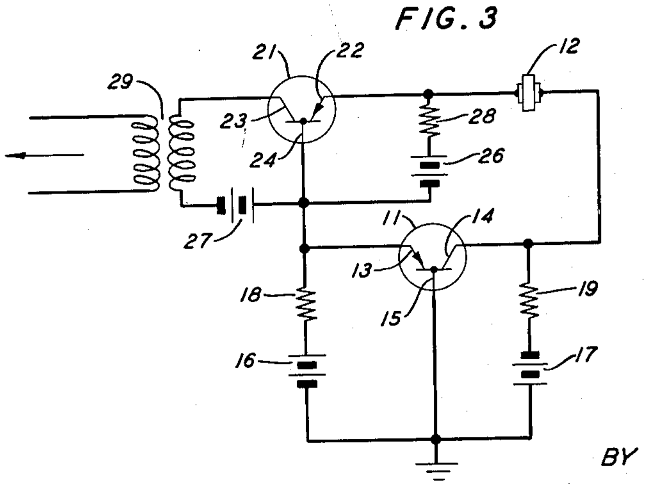
Fig. 3 illustrates a transistor oscillator-amplifier combination embodying the present invention.

One embodiment of the invention is shown in Fig. 3. There, the transistor oscillator is the same as that shown in Fig. 1, but the amplifier has its input side, i. e., its emitter-base path, connected in series with piezoelectric crystal 12 between the emitter and collector electrodes of transistor 11. Separate supply batteries are used for the oscillator and amplifier.

Figure 4:
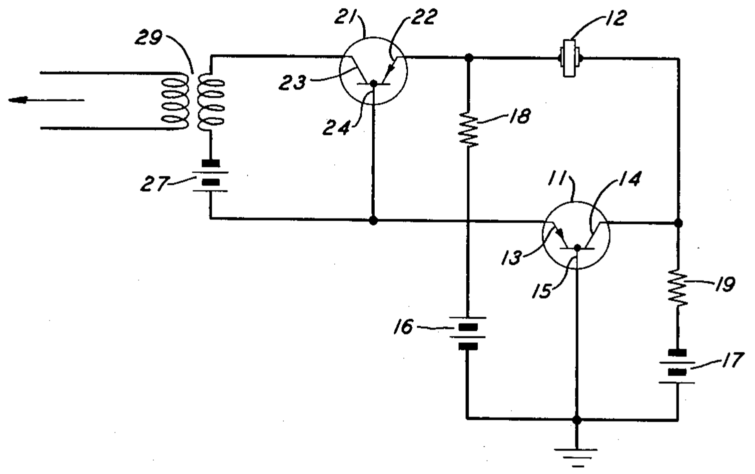
Figs. 4 and 5 represent variations of the circuit shown in Fig. 3.
Figure 5:
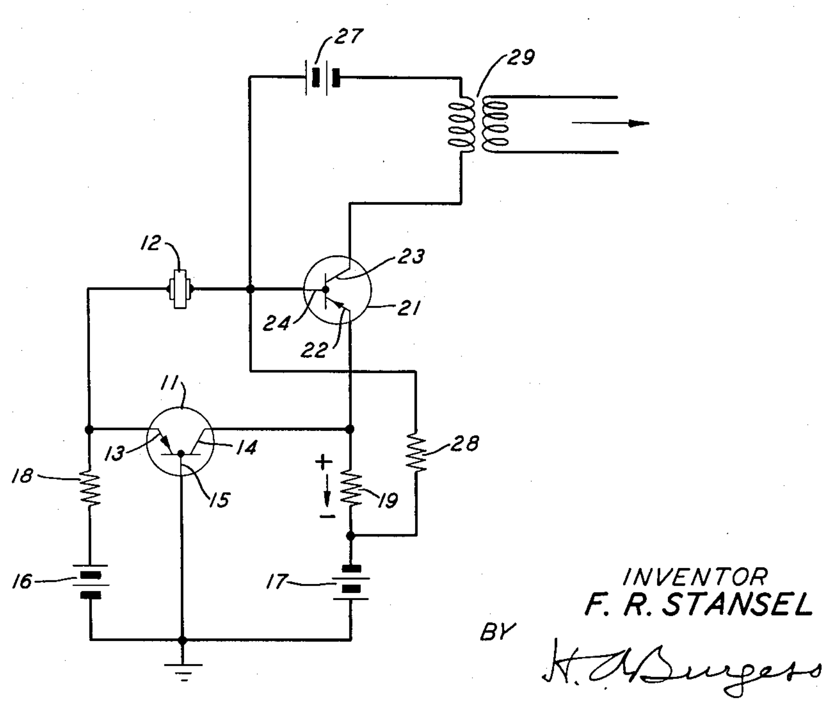

Two variations of the embodiment of the invention shown in Fig. 3 appear in Figs. 4 and 5, where common batteries are used to supply some of the oscillator and amplifier electrodes with operating potentials. In Fig. 4, transistors 11 and 21 are assumed to have substantially equal emitter currents, and their emitter electrodes are both supplied with a positive potential by battery 16. Well-known current dividing techniques may, of course, be employed if the two emitter currents are unequal. A resistor connected between the emitter and base electrodes of transistor 11 would, for example, suffice in the event that transistor 11 had the lower emitter current. Battery 16 and feed resistor 18 are connected in series between ground and the emitter of transistor 21, while the base of transistor 21 is connected to the emitter of transistor 11.

In Fig. 5, a common supply battery is used for the collector of the oscillator transistor and the emitter of the amplifier transistor. The base of the amplifier transistor 21 is connected to one side of crystal 12, and the emitter is connected to the collector of transistor 11. Direct-current feed resistor 28 is connected between the base of transistor 21 and the junction between load resistor 19 and battery 17 in the oscillator circuit. Current flows through load resistor 19 in the direction to supply the emitter electrode of transistor 21 with a positive potential.

The circuits of Figs. 4 and 5 are typical of many embodying the present invention which may be devised to reduce the number of batteries. The use of transistors having p-type semi-conductive bodies offers many additional possibilities for the combination of supply batteries. Such transistors may be used exclusively or in combination with transistors having *n*-type semiconductive bodies.

In the various circuits which have been described, it should be noted that all of the resistors, with the exception of load resistor 19 in Fig. 5, may, if desired, take the form of choke coils, since such elements would give the necessary impedance at signal frequencies. Load resistor 19 in Fig. 5, however, should be in the form of a resistor in order to supply the necessary direct potential to the emitter of transistor 21.

The battery polarities which are shown in the various figures of the drawings and which have been described were chosen under the assumption that all of the transistor bodies comprise *n*-type semiconductive material. Battery connections are reversed for transistors having bodies of *p*-type semiconductive material.

It is to be understood that the above-described arrangements are illustrative of the application of the principles of the invention. Numerous other arrangements may be devised by those skilled in the art without departing from the spirit and scope of the invention.

What is claimed is:

1. In combination, an oscillator comprising a transistor having emitter, collector, and base electrodes, means to supply operating potentials to said emitter and collector electrodes, and a frequency-determining impedance connected between the said emitter and collector electrodes, and an amplifier having its input side connected in series with said impedance in the path between said emitter and collector electrodes.

2. In combination, an oscillator comprising a transistor having emitter, collector, and base electrodes, means to supply operating potentials to said emitter and collector electrodes, and a piezoelectric crystal connected to form a feedback path between said emitter and collector electrodes, and an amplifier having its input side connected in series with said crystal in said feedback path.

3. In combination, an oscillator comprising a first transistor having emitter, collector, and base electrodes, means to supply operating potentials to the emitter and collector electrodes of said first transistor, and a frequency-determining impedance connected to form a feedback path between the emitter and collector electrodes of said first transistor, and an amplifier comprising a second transistor having emitter, collector, and base electrodes and means to supply operating potentials to the emitter and collector electrodes of said second transistor, the emitter-base path of said second transistor being connected in series with said impedance in said feedback path.

4. In combination, an oscillator comprising a first transistor having emitter, collector, and base electrodes, means to supply operating potentials to the emitter and collector electrodes of said first transistor, and a piezoelectric crystal connected between the emitter and collector electrodes of said first transistor, and an amplifier comprising a second transistor having emitter, collector, and base electrodes and means to supply operating potentials to the emitter and collector electrodes of said second transistor, the emitter-base path of said second transistor being connected in series with said crystal in the path between the emitter and collector electrodes of said first transistor.

5. In combination, a first transistor having emitter, collector, and base electrodes, a frequency-selective impedance connected between the emitter and collector electrodes of said first transistor, a second transistor having emitter, collector, and base electrodes and having its emitter-base path connected in series with said impedance between the emitter and collector electrodes of said first transistor, a first source of direct voltage connected to bias the emitter electrodes of both of said transistors in the forward direction, a second source of direct voltage connected to bias the collector electrode of said first transistor in the reverse direction, a third source of direct voltage connected to bias the collector electrode of said second transistor in the reverse direction, and signal output means connected in the collector-base path of said second transistor.

6. In combination, a first transistor having emitter, collector, and base electrodes, a frequency-selective impedance connected between the emitter and collector electrodes of said first transistor, a second transistor having emitter, collector, and base electrodes and having its emitter-base path connected in series with said impedance between the emitter and collector electrodes of said first transistor, a first source of direct voltage connected to bias the emitter electrode of said first transistor in the forward direction, a second source of direct voltage connected to bias the collector electrode of said first transistor in the reverse direction and the emitter electrode of said second transistor in the forward direction, a third source of direct voltage connected to bias the collector electrode of said second transistor in the reverse direction, and signal output means connected in the collector-base path of said second transistor.

References Cited in the file of this patent

UNITED STATES PATENTS

| | | |
|---|---|---|
| 2,303,862 | Peterson | Dec. 1, 1942 |
| 2,517,960 | Barney et al. | Aug. 8, 1950 |
| 2,570,436 | Eberhard et al. | Oct. 9, 1951 |

OTHER REFERENCES

Article: "Duality as a Guide in Transistor Design," by Wallace et al. from Bell Telephone System Technical Journal, vol. 30, pages 381–417, April 1951.